(12) United States Patent
Robb et al.

(10) Patent No.: US 6,515,345 B2
(45) Date of Patent: Feb. 4, 2003

(54) TRANSIENT VOLTAGE SUPPRESSOR WITH DIODE OVERLAYING ANOTHER DIODE FOR CONSERVING SPACE

(75) Inventors: Francine Y. Robb, Tempe, AZ (US); Jeffrey Pearse, Chandler, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 17 days.

(21) Appl. No.: 09/788,710

(22) Filed: Feb. 21, 2001

(65) Prior Publication Data

US 2002/0113293 A1 Aug. 22, 2002

(51) Int. Cl.[7] ............................................. H01L 29/00
(52) U.S. Cl. ................. 257/551; 257/105; 257/106; 257/481; 257/601; 257/603; 257/910
(58) Field of Search ............................. 257/481, 551, 257/601, 603, 910, 105, 106

(56) References Cited

U.S. PATENT DOCUMENTS

| | | | | | |
|---|---|---|---|---|---|
| 5,536,958 | A | * | 7/1996 | Shen et al. | 257/355 |
| 5,716,880 | A | * | 2/1998 | Verma | 148/DIG. 139 |
| 5,821,586 | A | * | 10/1998 | Yamaguchi et al. | 257/173 |
| 6,075,276 | A | * | 6/2000 | Kitamura | 257/199 |
| 6,348,716 | B1 | * | 2/2002 | Yun | 257/328 |

* cited by examiner

*Primary Examiner*—George Eckert
*Assistant Examiner*—Matthew E. Warren

(57) ABSTRACT

A semiconductor component includes a semiconductor layer (210) and at least one diode (220) in the semiconductor layer. The semiconductor component also includes an electrically insulative layer (230) over the semiconductor layer and the diode. The semiconductor component further includes at least one more diode (240, 250, 280, 290, 440, 450) over the electrically insulative layer, the semiconductor layer, and the diode in the semiconductor layer.

21 Claims, 4 Drawing Sheets

US 6,515,345 B2

TRANSIENT VOLTAGE SUPPRESSOR WITH DIODE OVERLAYING ANOTHER DIODE FOR CONSERVING SPACE

BACKGROUND OF THE INVENTION

This invention relates to electronics, in general, and to semiconductor components and methods of manufacturing.

Many electronic components, equipment, and high speed data and/or communication lines are highly sensitive to voltage spikes or surges caused by ElectroStatic Discharge (ESD), Electrical Fast Transients (EFT), and lightning. Accordingly, these highly sensitive components, equipment, and data lines must be protected from the voltage spikes or surges. Transient overvoltage protection or Transient Voltage Suppression (TFS) techniques are used to provide the necessary protection from the voltage spikes or surges. Many different TVS techniques exist including those techniques that use a single semiconductor die containing multiple devices and other techniques that use multiple semiconductor dice where each die contains a single device.

To minimize the effect of the parasitic bipolar and field effect transistors, the junction isolation can be formed by using isolation wells or tubs having heavy doping concentrations and deep junction depths reaching at least fifty micrometers into the semiconductor die. These isolation wells or tubs are formed during diffusion steps performed at very high temperatures and lasting for many hours. Furthermore, these isolation wells or tubs consume large amounts of area in the semiconductor die. Therefore, minimizing the problems associated with the parasitic bipolar and field effect transistors produces many other problems including a time-consuming manufacturing process and a large semiconductor die area required for the deep and heavily doped junction isolation.

An example of the TVS techniques using multiple semiconductor dice is a component commercially available from Semtech Corporation as part number LC03-6. In this component, four separate dice are wire bonded together in a single component package. Each semiconductor die has two back-to-back diode pairs, and each back-to-back diode pair comprises a low-voltage diode and a high-voltage diode to reduce the net capacitance of the back-to-back diode pair. This multiple die approach eliminates the parasitic bipolar and field effect transistor problems associated with junction isolation, but this multiple dice approach requires a more complicated, more time consuming, and more costly assembly process.

Accordingly, a need exists for a semiconductor component to protect electronic components, equipment, and data lines from voltage spikes or surges. It is desired for the semiconductor component to eliminate or at least E minimize the problems associated with junction isolation. A need also exists for a simple and cost-effective method of manufacturing the semiconductor component.

BRIEF DESCRIPTION OF THE DRAWINGS

The invention will be better understood from a reading of the following detailed description, taken in conjunction with the accompanying drawing figures in which.

Figure 1:
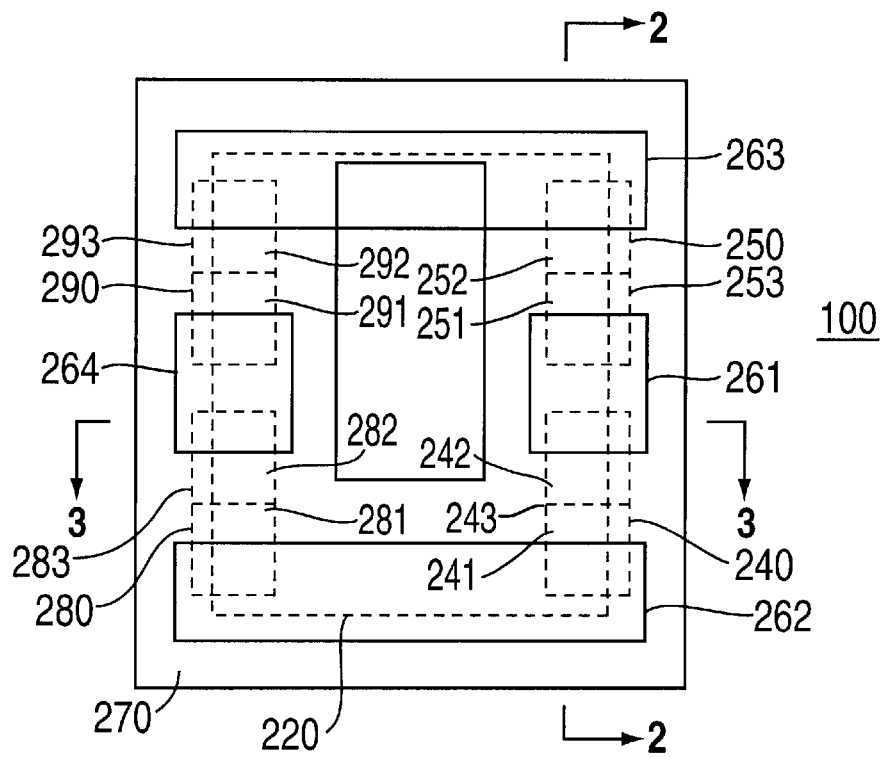
FIG. 1 illustrates a top view of a portion of a semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

Figure 2:
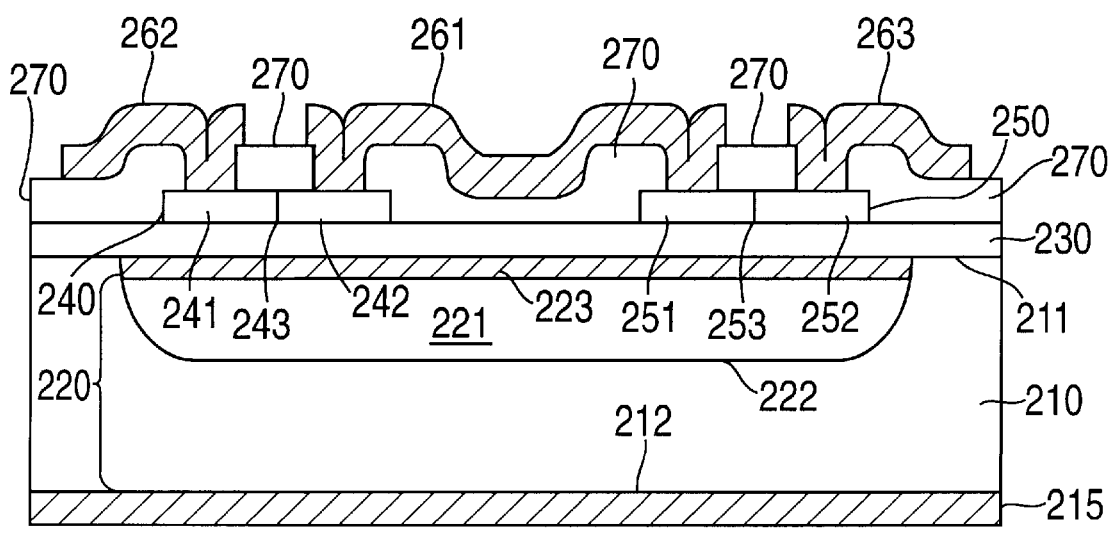
FIG. 2 illustrates a cross-sectional view of the portion of the semiconductor component of FIG. 1 taken along a section line 2—2 in FIG. 1 in accordance with an embodiment of the invention.
Figure 3:
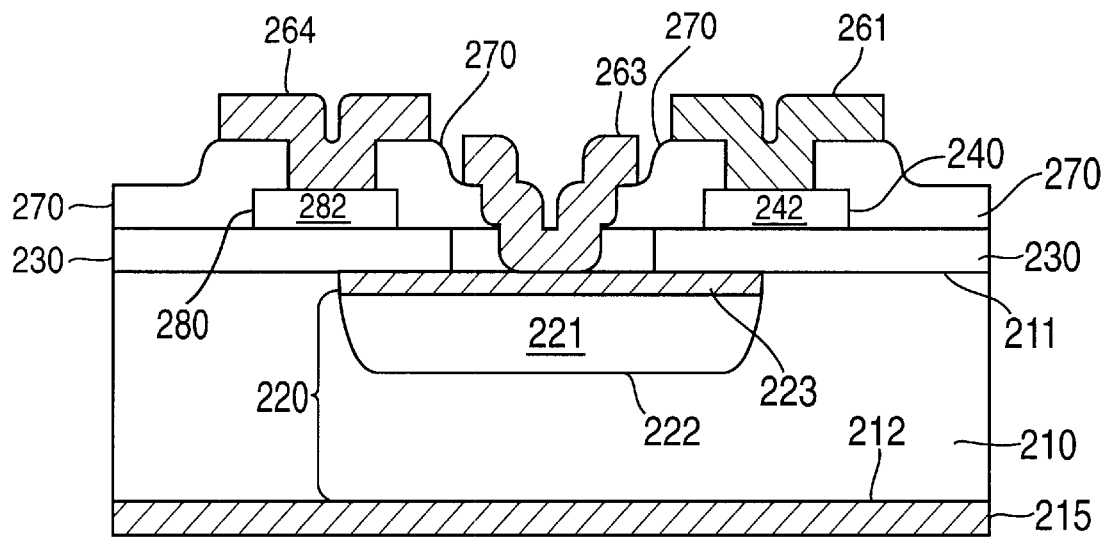
FIG. 3 illustrates a cross-sectional view of the portion of the semiconductor component of FIG. 1 taken along section line 3—3 in FIG. 1 in accordance with an embodiment of the invention.

FIG. 1 illustrates a top view of a portion of a semiconductor component 100. FIG. 2 illustrates a cross-sectional view of the portion of semiconductor component 100 taken along a section line 2—2 in FIG. 1, and FIG. 3 illustrates a cross-sectional view of the portion of semiconductor component 100 taken along a section line 3—3 in FIG. 1. In the preferred embodiment, semiconductor component 100 is a TVS array supported by a single semiconductor die. In other embodiments, semiconductor component 100 comprises the TVS array and other integrated circuitry supported by a single semiconductor die. The concepts disclosed herein concerning the TVS array can also be applied to other types of circuits.

As explained in more detail hereinafter with respect to the preferred embodiment, semiconductor component 100 includes a TVS array comprised of a surge-rated clamp diode comprised of crystalline silicon and a plurality of bridge diodes comprised of polycrystalline silicon. The clamp and bridge diodes are supported by a single semiconductor die. The clamp diode is a Zener diode to provide integrated clamping protection and to provide a high surge power rating for semiconductor component 100. The clamp diode is formed in a silicon substrate. The bridge diodes are formed from a polycrystalline silicon layer overlying an oxide layer that overlies the silicon substrate and the clamp diode. Each of the bridge diodes has a much lower parasitic capacitance than the clamp diode. The magnitude of the parasitic capacitance of each of the bridge diodes is minimized inherently by the limited thickness of the polycrystalline silicon layer in which the bridge diodes are formed.

The bridge diodes are electrically isolated from each other and from the clamp diode by the oxide layer to eliminate cross-talk. The electrical isolation provided by the oxide layer also eliminates the need for heavily doped, deep junction isolation tubs. The elimination of these tubs saves space and reduces the size of semiconductor component 100. Furthermore, the bridge diodes overlie at least part of the clamp diode to conserve space and further reduce the size of semiconductor component 100.

Turning to FIGS. 1, 2, and 3, semiconductor component 100 comprises a die having a semiconductor layer 210. Layer 210 has a top surface 211 and a bottom surface 212. In the preferred embodiment, layer 210 has a crystalline semiconductor structure, is comprised of silicon, and has a first conductivity type. As an example, layer 210 can be a p-type silicon substrate or wafer. In an alternative embodiment, layer 210 can have a polycrystalline or amorphous semiconductor structure and can also comprise other semiconductor materials including gallium arsenide, silicon carbide, silicon germanium, germanium, or the like.

Semiconductor component 100 further comprises a diode 220. Diode 220 is not directly visible in a top view of component 100 and is, therefore, represented in FIG. 1 by a dotted line. Diode 220 serves as the surge or clamp diode for semiconductor component 100. In the preferred embodiment, diode 220 is a Zener diode having a low breakdown voltage, preferably below approximately ten volts.

Further in the preferred embodiment, diode 220 is only a single diode and is not a portion of a larger device such as a bipolar transistor. Additionally, diode 220 preferably does not serve as a diode in a field termination ring that typically circumscribes high voltage Insulated Gate Bipolar Transistors (IGBTs).

Diode 220 is formed in semiconductor layer 210. Accordingly, diode 220 preferably has a crystalline semiconductor structure and is preferably comprised of silicon. Diode 220 is formed by implanting and/or diffusing a doped region 221 into surface 211 of layer 210.

Doped region 221 of diode 220 has a second conductivity type different from the first conductivity type of layer 210. In the preferred embodiment, doped region 221 has an n-type conductivity, and layer 210 has a p-type conductivity. Also in the preferred embodiment, doped region 221 has a high doping concentration of approximately $5 \times 10^{19}$ to $5 \times 10^{20}$ atoms per centimeter cubed, and layer 210 has a lower doping concentration of approximately $1 \times 10^{17}$ to $1 \times 10^{19}$ atoms per centimeter cubed. The presence of doped region 221 in layer 210 forms a p-n junction 222 in layer 210. Therefore, diode 220 is preferably a p-n junction diode. In an alternative embodiment, diode 220 can be devoid of a p-n junction and can, instead, have a metal-semiconductor junction forming a Schottky diode.

Diode 220 can also include an optional silicide layer 223 at surface 211 of semiconductor layer 210. Layer 223 is located over p-n junction 222 and is also located between p-n junction 222 and an electrically insulative layer subsequently formed over surface 211 of layer 210. When semiconductor layer 210 is comprised of silicon, silicide layer 223 can be comprised of titanium silicide, molybdenum silicide, platinum silicide, tungsten silicide, or the like.

Optional layer 223 improves the electrical performance of diode 220 by increasing the current spreading of diode 220 and by making the current distribution across diode 220 more uniform. Layer 223 also improves the electrical contact to diode 220 by lowering the contact resistance of diode 220. Accordingly, silicide layer 223 also can assist in minimizing the total size of semiconductor component 100 by minimizing the area that a subsequently formed metal layer requires to contact diode 220. Minimizing the diode contact area also increases the amount of area usable for the subsequently formed bridge diodes that partially or fully overlie diode 220.

As illustrated in FIGS. 2 and 3, semiconductor component 100 additionally comprises an electrically insulative layer 230. Layer 230 is formed over surface 211 of layer 210 and p-n junction 222 of diode 220. As an example, layer 230 can comprise silicon dioxide, silicon nitride, silicon oxy-nitride, aluminum nitride, Tetra-Ethyl-Ortho-Silicate (TEOS), or the like. As illustrated in FIG. 3, electrically insulative layer 230 is preferably located over only a portion of semiconductor layer 210 and over only a portion of diode 220.

Semiconductor component 100 also comprises diodes 240 and 250 and optional diodes 280 and 290. Diodes 240, 250, 280, and 290 are not directly visible from a top view of semiconductor component 100 and are, therefore, represented in FIG. 1 by dashed lines. In the preferred embodiment, each of diodes 240, 250, 280, and 290 is a bridge diode in component 100. Also in the preferred embodiment, each of diodes 240, 250, 280, and 290 is only a single diode and is not a portion of a larger device such as a bipolar transistor.

Each of diodes 240, 250, 280, and 290 has a breakdown voltage. Each of the breakdown voltages of diodes 240, 250, 280, and 290 is preferably greater than the breakdown voltage of diode 220. In the preferred embodiment, each of the breakdown voltages of diodes 240, 250, 280, and 290 are approximately twelve volts.

In an alternative embodiment, however, all, some, or just one of the breakdown voltages of diodes 240, 250, 280, and 290 can be the same as or less than the breakdown voltage for diode 220. Furthermore, in an alternative embodiment, the breakdown voltages of all, some, or just one of the breakdown voltages of diodes 240, 250, 280, and 290 can be greater than or less than the breakdown voltages of the remaining ones of diodes 240, 250, 280, and 290.

Each of diodes 240, 250, 280, and 290 is located adjacent to each other and is also located over electrically insulative layer 230, surface 211 of semiconductor layer 210, and diode 220. Each of diodes 240, 250, 280, and 290 overlies at least a portion of diode 220 to conserve space and to minimize the size of semiconductor component 100. As illustrated in FIG. 1, only portions of each of diodes 240, 250, 280, and 290 are located over diode 220. In a different embodiment, diode 220 can underlie all, some, or just one of diodes 240, 250, 280, and 290. Each of diodes 240, 250, 280, and 290 is located over only a portion of electrically insulative layer 230 and over only a portion of semiconductor layer 210.

Diodes 240, 250, 280, and 290 are preferably identical in shape, size, composition, and doping to each other. For example, each of diodes 240, 250, 280, and 290 is preferably comprised of the same semiconductor material as layer 210, and each of diodes 240, 250, 280, and 290 preferably has a polycrystalline semiconductor structure. In an alternative embodiment, each, some, or just one of diodes 240, 250, 280, and 290 can be comprised of a semiconductor material different from that of layer 210 and can also have a crystalline or amorphous semiconductor structure.

Also in the preferred embodiment, diode 240 has a lightly doped region 241 of the first conductivity type and a heavily doped region 242 of the second conductivity type. The interface of doped regions 241 and 242 forms a p-n junction 243, which makes diode 240 a p-n junction diode. P-n junction 243 is substantially perpendicular to surface 211 of semiconductor layer 210.

Similarly, in the preferred embodiment, diode 250 has a lightly doped region 251 of the first conductivity type and a heavily doped region 252 of the second conductivity type. The interface of doped regions 251 and 252 forms a p-n junction 253, which makes diode 250 a p-n junction diode. P-n junction 253 of diode 250 is substantially parallel to p-n junction 243 of diode 240 and is substantially perpendicular to surface 211 of semiconductor layer 210.

Optional diode 280 can have a lightly doped region 281 of the first conductivity type and a heavily doped region 282 of the second conductivity type. The interface of doped regions 281 and 282 forms a p-n junction 283, which makes diode 280 a p-n junction diode. P-n junction 283 of diode 280 is substantially parallel to p-n junction 243 of diode 240 and p-n junction 253 of diode 250 and is substantially perpendicular to surface 211 of semiconductor layer 210.

Similarly, diode 290 can have a lightly doped region 291 of the first conductivity type and a heavily doped region 292 of the second conductivity type. The interface of doped regions 291 and 292 forms a p-n junction 293, which makes diode 290 a p-n junction diode. P-n junction 293 of diode 290 is substantially parallel to p-n junction 243 of diode 240, p-n junction 253 of diode 250, and p-n junction 283 of diode 280. P-n junction 293 of diode 290 is also substantially perpendicular to surface 211 of semiconductor layer 210.

In the preferred embodiment, the areas of p-n junctions 243, 253, 283, and 293 in diodes 240, 250, 280, and 290, respectively, are each approximately the same and are each smaller than the area of p-n junction 222 in diode 220. Accordingly, the parasitic capacitances of diodes 240, 250, 280, and 290 are each approximately the same and are each smaller than the parasitic capacitance of diode 220. When diodes 240, 250, 280, and 290 are formed from a polycrystalline silicon layer, the small parasitic capacitances of diodes 240, 250, 280, and 290 can be minimized inherently by semiconductor processing constraints that limit the deposited thickness of the polycrystalline silicon layer. As an example, each of diodes 240, 250, 280, and 290 can be approximately 0.5 micrometers thick and approximately 2000 micrometers wide. In this embodiment, each of diodes 240, 250, 280, and 290 can provide protection against an ESD peak current of approximately 10 amperes.

In an alternative embodiment, each, some, or just one of diodes 240, 250, 280, and 290 can be one of a plurality of back-to-back p-n junction diodes to provide higher voltage protection and temperature compensation. In another alternative embodiment, each, some, or just one of diodes 240, 250, 280, and 290 can comprise a metal-semiconductor junction forming a Schottky diode.

Semiconductor component 100 additionally comprises another electrically insulative layer 270. Layer 270 is located over surface 211 of semiconductor layer 210, electrically insulative layer 230, diodes 240, 250, 280, and 290, and p-n junction 222 of diode 220. Layer 270 can be comprised of the same or different electrically insulative material as layer 230. Electrically insulative layer 270 is preferably located over only a portion of semiconductor layer 210, over only a portion of diode 220, and over only a portion of diodes 240, 250, 280, and 290.

Semiconductor component 100 further comprises an electrically conductive layer over surface 211 of semiconductor layer 210, electrically insulative layers 230 and 270, diodes 240, 250, 280, and 290, and p-n junction 222 of diode 220. In the preferred embodiment, the electrically conductive layer is a metal layer comprised of gold, copper, aluminum, titanium, tungsten, or the like. Component 100 also comprises a wire bond (not shown in FIGS. 1, 2, or 3), a lead frame (not shown in FIGS. 1, 2, or 3), and a back metal layer 215 (FIGS. 2 and 3) adjacent to surface 212 of layer 210. In the preferred embodiment, back metal layer 215 is comprised of gold, copper, aluminum, titanium, tungsten, nickel, vanadium, or the like.

Diodes 240 and 220 are electrically coupled together, and diodes 280 and 220 are electrically coupled together. The term "coupled", as used herein, is defined as directly or indirectly connected in an electrical manner. For example, portion 262 of the electrically conductive layer, the wire bond, the lead frame, and back metal layer 215 electrically couples doped region 241 of diode 240 to a lighter doped portion of diode 220 having the first conductivity type. In particular, back metal layer 215 is connected to the lighter doped portion of diode 220 and is mounted on the lead frame. The wire bond is connected from the lead frame to portion 262 of the electrically conductive layer, and as illustrated in FIG. 2, portion 262 of the electrically conductive layer is connected to doped region 241 of diode 240. Portion 262 of the electrically conductive layer, the wire bond, the lead frame, and back metal layer 215 also electrically couple doped region 281 of diode 280 to the lighter doped portion of diode 220. Accordingly, diodes 240 and 280 are also electrically coupled together by portion 262 of the electrically conductive layer.

Diodes 250 and 220 are electrically coupled together, and diodes 290 and 220 are electrically coupled together. In particular, as illustrated in FIGS. 1, 2, and 3, portion 263 of the electrically conductive layer electrically connects doped region 252 of diode 250 to doped region 221 of diode 220. Similarly, portion 263 of the electrically conductive layer electrically connects doped region 292 of diode 290 to doped region 221 of diode 220. Accordingly, diodes 250 and 290 are also electrically coupled together by portion 263 of the electrically conductive layer.

Diodes 240 and 250 are electrically coupled together, and diodes 280 and 290 are electrically coupled together. In particular, as illustrated in FIGS. 1 and 2, a portion 261 of the electrically conductive layer electrically connects doped region 242 of diode 240 to doped region 251 of diode 250. Similarly, a portion 264 of the electrically conductive layer electrically connects doped region 282 of diode 280 to doped region 291 of diode 290.

Figure 4:
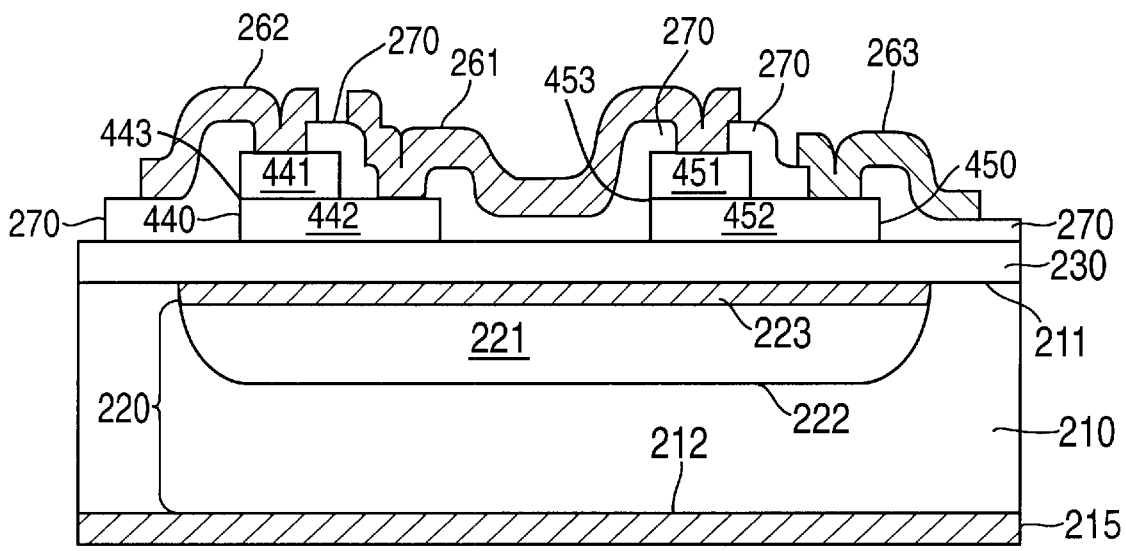
FIG. 4 illustrates a cross-sectional view of a portion of a different semiconductor component in accordance with an embodiment of the invention.

FIG. 4 illustrates a cross-sectional view of a portion of a semiconductor component 400. Component 400 is an alternative embodiment of semiconductor component 100 in FIGS. 1, 2, and 3. In particular, the cross-sectional view of component 400 in FIG. 4 is an alternative embodiment of the cross-sectional view of component 100 in FIG. 2.

As illustrated in FIG. 4, component 400 has, among other features, diodes 440 and 450, which are similar to diodes 240 and 250, respectively, of component 100 in FIG. 2. Diode 440 has doped regions 441 and 442, and diode 450 has doped regions 451 and 452. Doped regions 441, 442, 451, and 452 in FIG. 4 are similar to doped regions 241, 242, 251, and 252 in FIG. 2. Diodes 440 and 450 also have p-n junctions 443 and 453, respectively, which are located between doped regions 441 and 442 and between doped regions 451 and 452, respectively.

Although not illustrated in FIG. 4, one skilled in the art will understand that component 400 can also include two additional, but optional, bridge diodes. These optional bridge diodes in component 400 are similar in function to diodes 280 and 290 of component 100 in FIG. 1. All of the bridge diodes of component 400 in FIG. 4, however, are preferably structurally different from the bridge diodes of component 100 in FIG. 2. For example, the p-n junctions of diodes 440 and 450 in FIG. 4, namely p-n junctions 443 and 453, are substantially parallel to surface 211 of semiconductor layer 210. The p-n junctions of diodes 240, 250, 280, and 290 in FIGS. 1, 2, and 3, however, are substantially perpendicular to surface 211 of layer 210.

Each of the bridge diodes in semiconductor component 400 are preferably formed simultaneously with each other. For example, doped regions 442 and 452 in diodes 440 and 450, respectively, can be formed from the same semiconductor layer. Similarly, doped regions 441 and 451 in diodes 440 and 450, respectively, can be formed from the different semiconductor layer that is formed over the previous semiconductor layer.

Component 400 in FIG. 4 is less planar than component 100 in FIG. 2. Accordingly, component 400 may have more step coverage problems than component 100. Furthermore, the formation of the bridge diodes of component 400 may be more complicated, more costly, and more time consuming than the formation of the bridge diodes of component 100 because the bridge diodes of component 100 can be formed from a single semiconductor layer while the bridge diodes of component 400 are formed from two different semiconductor layers.

Figure 5:
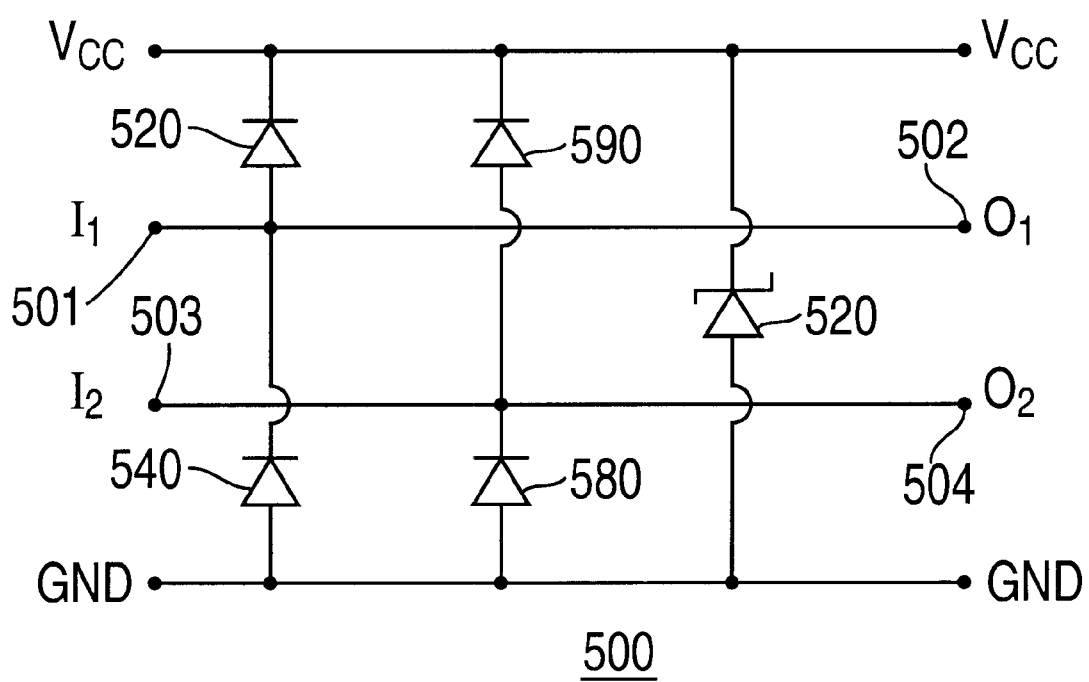
FIG. 5 illustrates a circuit diagram of the semiconductor components in accordance with an embodiment of the invention.

FIG. 5 illustrates a circuit 500, which is a circuit diagram for semiconductor component 100 in FIGS. 1, 2, and 3 and also for semiconductor component 400 in FIG. 4. Circuit 500 is similar to the circuit diagram for the previously described component that is commercially available from ST Microelectronics as part number USB6Bx. Accordingly, the operation of circuit 500 is known to those skilled in the art.

Circuit 500 comprises bridge diodes 540 and 550 and a surge or clamp diode 520. Circuit 500 can also comprise optional bridge diodes 580 and 590. Diodes 520, 540, 550, 580, and 590 of circuit 500 in FIG. 5 represent diodes 220, 240, 250, 280, and 290, respectively, of component 100 in FIG. 1. Diodes 520, 540, and 550 of circuit 500 in FIG. 5 also represent diodes 220, 440, and 450, respectively, of component 400 in FIG. 4.

Diodes 540 and 550 are electrically coupled together, and optional diodes 580 and 590 are electrically coupled together. Diode 220 is electrically coupled to diodes 550 and 590, and diode 220 is also electrically coupled to diodes 540 and 580. Diodes 540, 580, and 520 are electrically coupled to a ground node (GND), and diodes 520, 550, 590 are electrically coupled to a power supply node ($V_{cc}$).

Circuit 500 further includes an input node (I1) 501 coupled to an output node (O1) 502. Nodes 501 and 502 are electrically coupled to diodes 540 and 550. When circuit 500 includes optional diodes 580 and 590, circuit 500 also includes an additional input node (I2) 503 coupled to an additional output node (O2) 504. Nodes 503 and 504 are electrically coupled to diodes 580 and 590.

Clamp diode 520 has a lower breakdown voltage than bridge diodes 540, 550, 580, and 590. Clamp diode 520 conducts surge currents during reverse bias breakdown conditions caused by transients at the ground and power supply nodes. Bridge diodes 540, 550, 580, and 590 preferably only conduct surge currents under forward bias conditions caused by transients at input node 501 and/or output nodes 502 or 504. At any given transient magnitude, higher surge currents can be accommodated in the forward bias mode than under the reverse bias mode so bridge diodes 540, 550, 580, and 590 can be smaller than clamp diode 520 to lower the parasitic capacitance in circuit 500.

Figure 6:
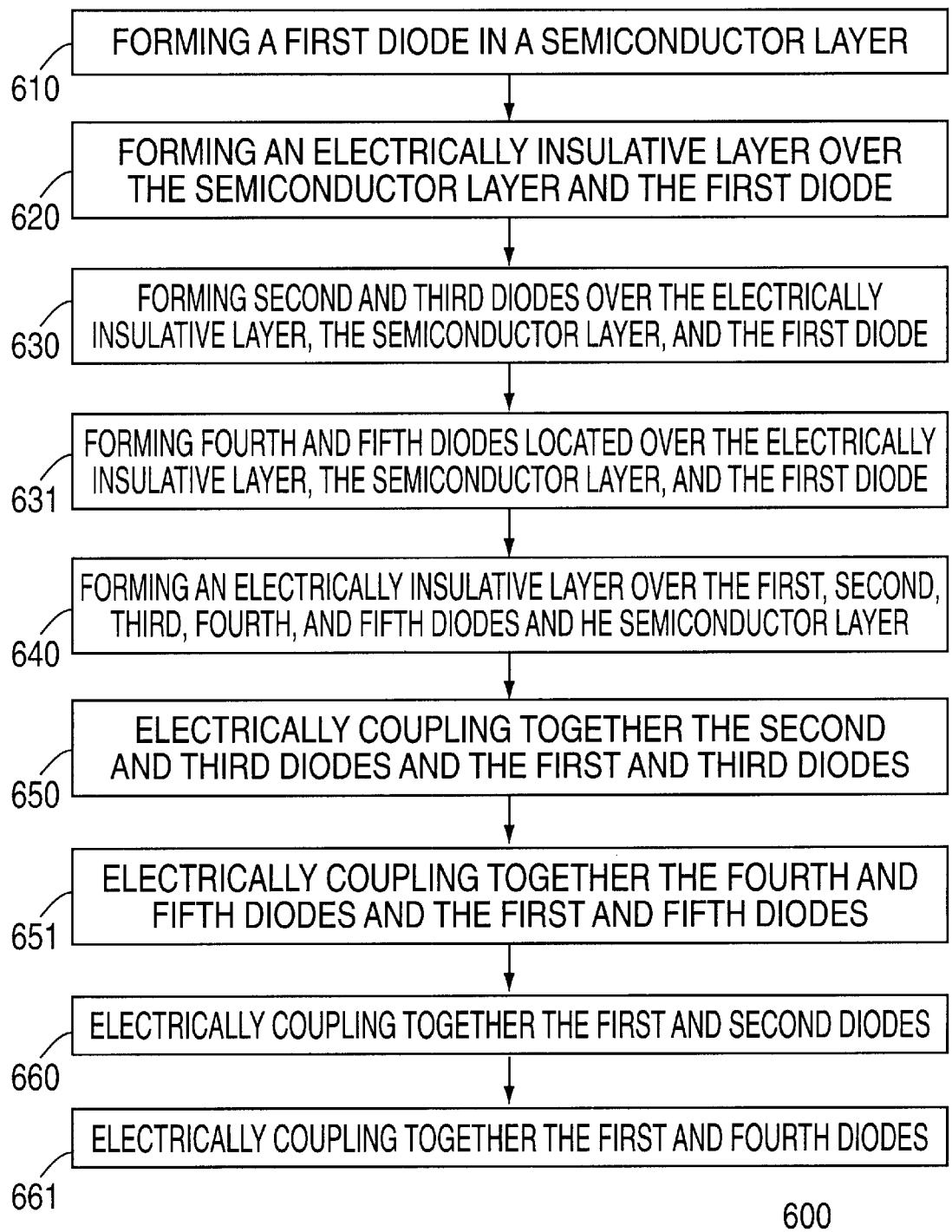
FIG. 6 illustrates a flow chart of a method of manufacturing the semiconductor component in accordance with an embodiment of the invention.

FIG. 6 illustrates a flow chart 600 of a method of manufacturing a semiconductor component, such as semiconductor component 100 in FIGS. 1, 2, and 3 or such as semiconductor component 400 in FIG. 4. At a step 610 of flow chart 600 in FIG. 6, a first diode is formed in a semiconductor layer. The semiconductor layer has a first dopant of a first conductivity type. The first dopant has a doping concentration chosen to produce a desired clamp diode breakdown. As an example, the semiconductor layer in step 610 can be similar to semiconductor layer 210 in FIGS. 2, 3, and 4. Furthermore, the first diode in step 610 can be similar to diode 220 in FIGS. 1, 2, 3, and 4.

During step 610, an initial oxide layer can be thermally grown over a top surface of the semiconductor layer. Next, a photoresist mask is formed over the top surface of the initial oxide layer and is used to define an etched opening into the initial oxide layer. After etching the opening, the photoresist mask is removed. A dopant of a second conductivity type is implanted into the etched opening in the initial oxide layer to produce an implanted doped region having a high doping concentration in the semiconductor layer. As an example, the dopant in the doped region can be phosphorous or arsenic. The implanted dopant is then diffused into the semiconductor layer. In an embodiment where the first diode has a silicide layer, the silicide layer can be formed using a conventional silicide process after diffusing the dopant and after removing the initial oxide layer.

At a step 620 of flow chart 600 in FIG. 6, an electrically insulative layer is formed over the semiconductor layer and the first diode. As an example, the electrically insulative layer of step 620 can be similar to electrically insulative layer 230 in FIGS. 2, 3, and 4. In an embodiment where the first diode does not include a silicide layer, the previously described diffusion step can also be used to simultaneously thermally grow the electrically insulative layer over the semiconductor layer. In this embodiment, steps 610 and 620 are performed simultaneously with each other. In a different embodiment where the first diode does include the silicide layer, the electrically insulative layer is formed after forming the silicide layer.

Next, at a step 630 of flow chart 600 in FIG. 6, second and third diodes are formed adjacent to each other and are located over the electrically insulative layer, the semiconductor layer, and the first diode. As an example, the second and third diodes in step 630 can be similar to diodes 240 and 250 in FIGS. 1, 2, and 3 and can also be similar to diodes 440 and 450 in FIG. 4. In the preferred embodiment, the first and second diodes are manufactured simultaneously with each other.

Flow chart 600 also includes an optional step 631 where optional fourth and fifth diodes are formed adjacent to the second and third diodes and to each other and are located over the electrically insulative layer, the semiconductor layer, and the first diode. As an example, the fourth and fifth diodes of optional step 631 can be similar to diodes 280 and 290 in FIG. 1. When step 631 is performed, steps 630 and 631 are preferably performed simultaneously such that the second, third, fourth, and fifth diodes are manufactured at the same time.

During steps 630 and 631, a polycrystalline silicon layer can be deposited over the electrically insulative layer of step 620. The polycrystalline silicon layer can be deposited to have a low concentration of a dopant having the first conductivity type, or the dopant can be implanted into the entire polycrystalline silicon layer after depositing the polycrystalline silicon layer. As an example, the dopant can be boron. Next, a photoresist mask can be formed over the polycrystalline silicon layer, and the exposed portions of the polycrystalline silicon layer can be etched and removed. Then, the photoresist mask is removed.

Another photoresist mask is subsequently formed over the remaining portions of the polycrystalline silicon layer to define implanted regions having high doping concentrations of a different dopant having the second conductivity type. As an example, the different dopant can be phosphorous or arsenic. After implanting the different dopant, the photoresist mask can be removed, and the different dopant is diffused. As an example, the diffusion can be performed at approximately 900 degrees Celsius.

Next, at a step 640 of flow chart 600 in FIG. 6, an electrically insulative layer is formed over the second, third, fourth, and fifth diodes of steps 630 and 631, the electrically insulative layer of step 620, and also over the semiconductor layer and the first diode of step 610. As an example, the electrically insulative layer of step 640 can be similar to electrically insulative layer 270 of FIGS. 1, 2, 3, and 4.

The electrically insulative layer of step 640 can be patterned. As an example, a photoresist mask can be formed over the electrically insulative layer of step 640. Next, the electrically insulative layer can be etched, and then, the photoresist mask can be removed. The patterning process of the electrically insulative layer of step 640 can also be used to pattern the electrically insulative layer of step 620.

Then, at a step 650 of flow chart 600 in FIG. 6, the second and third diodes are electrically coupled together, and the first and third diodes are electrically coupled together. In the preferred embodiment, the electrical coupling of the second and third diodes and the electrical coupling of the first and third diodes are performed simultaneously with each other.

Flow chart 600 also includes an optional step 651 where the optional fourth and fifth diodes are electrically coupled together and where the first and optional fifth diodes are electrically coupled together. When step 651 is performed, steps 650 and 651 are preferably performed simultaneously such that the second and third diodes, the first and third diodes, the fourth and fifth diodes, and the first and fifth diodes are electrically coupled together at the same time.

During steps 650 and 651, a metal layer can be deposited over the electrically insulative layer of step 640, and a photoresist mask can be formed over the metal layer. Next, the exposed portions of the metal layer can be etched, and then, the photoresist mask can be removed.

At a step 660 of flow chart 600 in FIG. 6, the first and second diodes are electrically coupled together. Flow chart 600 also includes an optional step 661 where the first diode and the optional fourth diode are electrically coupled together. When step 661 is performed, steps 660 and 661 are performed simultaneously such that the first and second diodes and the first and fourth diodes are electrically coupled together at the same time.

During steps 660 and 661, a back surface of the semiconductor layer of step 610 can be ground, etched, and/or polished to decrease the thickness of the semiconductor layer. Then, a back metal layer can be deposited over the back surface of the semiconductor layer. As an example, the back metal layer can be similar to back metal layer 215 in FIGS. 2, 3, and 4. Next, the back metal layer can be attached to a lead frame to mount the semiconductor layer over the lead frame. Subsequently, a first end of a wire bond can be attached to the lead frame, and a second end of the wire bond can be attached to the metal layer of steps 650 and 651.

Other wire bonds are used to couple other portions of the electrically conductive layer to different leads of the lead frame. As an example, the other portions of the electrically conductive layer can be similar to portions 261, 263, and 264 of the electrically conductive layer in FIGS. 1, 2, and 3.

Therefore, an improved semiconductor component and method of manufacturing is provided to overcome the disadvantages of the prior art. The method of manufacturing the semiconductor component builds electrically isolated bridge diodes coupled to a Zener clamp diode in a TVS array. The method of manufacturing is simple, cost-effective, and compatible with conventional semiconductor processing. The resulting TVS array or semiconductor component protects electronic components, equipment, and data lines from voltage spikes or surges.

The semiconductor component eliminates the problems associated with junction isolation and multiple die assembly by using a single semiconductor die and an electrically insulative layer to provide electrical isolation between the various devices within the single semiconductor die. The electrically insulative layer electrically isolates the bridge diodes from each other and from the clamp diode and also eliminates cross-talk between the diodes. The electrical isolation provided by the electrically insulative layer eliminates the need for heavily doped, deep junction isolation tubs. The elimination of the isolation tubs saves space and reduces the size and cost of the semiconductor component. The use of a single semiconductor die in the semiconductor component also reduces the size and cost of the semiconductor component.

The bridge diodes overlie at least part of the clamp diode to conserve space and to further reduce the size and cost of the semiconductor component. This vertical stacking of the diodes can reduce the size of the semiconductor component by at least fifty percent compared to the multiple die components and also compared to the single die components using junction isolation tubs.

The use of polycrystalline silicon bridge diodes inherently keeps the parasitic capacitance of the bridge diodes low to improve the electrical performance of the semiconductor component. Other portions of the polycrystalline silicon layer can be used to integrated polycrystalline silicon resistors and polycrystalline silicon-to-metal capacitors into the semiconductor component. Still other portions of the polycrystalline silicon layer can be used to form heavily doped polycrystalline silicon interconnects. The polycrystalline silicon interconnects can replace metal interconnects and can permit the formation of a higher density component compared to a component using metal interconnects because the pitch of a polycrystalline silicon interconnect line can be smaller than the pitch for a metal interconnect line. The pitch of an interconnect line is defined as the minimum width of the interconnect line plus the minimum width of the space between the interconnect line and a laterally adjacent interconnect line.

Although the invention has been described with reference to specific embodiments, it will be understood by those skilled in the art that various changes may be made without departing from the spirit or scope of the invention. For instance, the numerous details set forth herein such as, for example, the material compositions and the crystalline, polycrystalline, or amorphous structures are provided to facilitate the understanding of the invention and are not provided to limit the scope of the invention. As another example, semiconductor layer 210 in FIG. 2 can have more than one diode. As yet another example, more than four diodes can be formed over the diode or diodes in the semiconductor layer. Additionally, the vertical stacking concept can be expanded to have more than two layers of diodes. For example, in FIG. 2, an additional layer of polycrystalline silicon bridge diodes can be formed over electrically insulative layer 270. Furthermore, additional electrically insulative layers can be formed over or under the polycrystalline silicon bridge diodes. Moreover, the bridge diodes and the clamp diode can be formed in opposing silicon layers of a silicon-on-insulator substrate. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A semiconductor component, comprising:
   a semiconductor layer;
   a first diode in the semiconductor layer;
   an electrically insulative layer over the semiconductor layer and the first diode; and
   a second diode overlaying the electrically insulative layer, the semiconductor layer, and the first diode.
2. The semiconductor component of claim 1 wherein the second diode is located over only a portion of the first diode.
3. The semiconductor component of claim 1 wherein the first diode comprises a p-n junction in the semiconductor layer.
4. The semiconductor component of claim 3 wherein:
   the first diode further comprises:
      a silicide layer located over the p-n junction and located between the p-n junction and the electrically insulative layer.
5. The semiconductor component of claim 1 further comprising:
   an other electrically insulative layer over the second diode; and
   a third diode over the other electrically insulative layer, the semiconductor layer, and the first diode.
6. The semiconductor component of claim 1 wherein the second diode further comprises a p-n junction.
7. The semiconductor component of claim 6 wherein:
   the semiconductor layer has a surface;
   the electrically insulative layer and the second diode are located over the surface of the semiconductor layer;
   and the p-n junction of the second diode is substantially perpendicular to the surface of the semiconductor layer.
8. The semiconductor component of claim 6 wherein:
   the semiconductor layer has a surface;
   the electrically insulative layer and the second diode are located over the surface of the semiconductor layer; and
   the p-n junction of the second diode is substantially parallel to the surface of the semiconductor layer.
9. The semiconductor component of claim 1 wherein the semiconductor layer and the first diode are comprised of a crystalline semiconductor material, and the second diode is comprised of a polycrystalline semiconductor material.
10. The semiconductor component of claim 1 wherein the semiconductor component comprises a transient voltage suppression array.
11. The semiconductor component of claim 1 further comprising a third diode located adjacent to the second diode and located over the electrically insulative layer, the semiconductor layer, and the first diode.
12. The semiconductor component of claim 11 wherein:
    the second and third diodes are electrically coupled together;
    the first and second diodes are electrically coupled together; and
    the first and third diodes are electrically coupled together.
13. The semiconductor component of claim 12 wherein:
    the first diode has a first breakdown voltage;
    the second diode has a second breakdown voltage greater than the first breakdown voltage; and
    the third diode has a third breakdown voltage greater than the first breakdown voltage.
14. The semiconductor component of claim 13 wherein the second and third breakdown voltages are approximately equal to each other.
15. The semiconductor component of claim 12 further comprising:
    a fourth diode located adjacent to the second and third diodes and located over the electrically insulative layer, the semiconductor layer, and the first diode; and
    a fifth diode located adjacent to the second, third, and fourth diodes and located over the electrically insulative layer, the semiconductor layer, and the first diode, wherein:
       the fourth and fifth diodes are electrically coupled together;
       the first and fourth diodes are electrically coupled together; and
       the first and fifth diodes are electrically coupled together.
16. The semiconductor component of claim 15 wherein:
    the first diode has a first breakdown voltage;
    the second diode has a second breakdown voltage greater than the first breakdown voltage;
    the third diode has a third breakdown voltage greater than the first breakdown voltage;
    the fourth diode has a fourth breakdown voltage greater than the first breakdown voltage; and
    the fifth diode has a fifth breakdown voltage greater than the first breakdown voltage.
17. The semiconductor component of claim 16 wherein the second, third, fourth, and fifth breakdown voltages are approximately equal to each other.
18. A transient voltage suppressor comprising:
    a crystalline silicon substrate;
    a p-n junction Zener diode in the crystalline silicon substrate;
    a first electrically insulative layer over the crystalline silicon substrate and the p-n junction Zener diode;
    a first p-n junction diode comprised of polycrystalline silicon and overlaying the first electrically insulative layer, the crystalline silicon substrate, and the p-n junction Zener diode;
    a second p-n junction diode comprised of polycrystalline silicon overlaying the first electrically insulative layer, the crystalline silicon substrate, and the p-n junction Zener diode; and a second electrically insulative layer formed over the first electrically insulative layer for electrically isolating the first p-n junction diode from the second p-n junction diode.

19. The transient voltage suppressor of claim 18 wherein:

the first p-n junction diode is electrically connected to the second p-n junction diode and the p-n junction Zener diode;

the second p-n junction diode is electrically connected to the p-n junction Zener diode;

the p-n junction Zener diode has a first breakdown voltage;

the first p-n junction diode has a second breakdown voltage greater than the first breakdown voltage; and the second p-n junction diode has a third breakdown voltage approximately equal to the second breakdown voltage and greater than the first breakdown voltage.

20. The transient voltage suppressor of claim 18 further comprising:

a third p-n junction diode comprised of polycrystalline silicon, located over the first electrically insulative layer, the crystalline silicon substrate, and the p-n junction Zener diode; and a fourth p-n junction diode comprised of polycrystalline silicon, located adjacent to the first, second, and third p-n junction diodes, and located over the first electrically insulative layer, the crystalline silicon substrate, and the p-n junction Zener diode, wherein the second electrically insulative layer electrically isolates the first, second, third and fourth p-n junction diodes from each other.

21. The transient voltage suppressor of claim 20 wherein:

the first p-n junction diode is electrically connected to the second p-n junction diode and the p-n junction Zener diode;

the second p-n junction diode is electrically connected to the p-n junction Zener diode;

the third p-n junction diode is electrically connected to the fourth p-n junction diode and the p-n junction Zener diode;

the fourth p-n junction diode is electrically connected to the p-n junction Zener diode;

the p-n junction Zener diode has a first breakdown voltage;

the first p-n junction diode has a second breakdown voltage greater than the first breakdown voltage;

the second p-n junction diode has a third breakdown voltage approximately equal to the second breakdown voltage and greater than the first breakdown voltage;

the third p-n junction diode has a fourth breakdown voltage approximately equal to the second and third breakdown voltages and greater than the first breakdown voltage; and the fourth p-n junction diode has a fifth breakdown voltage approximately equal to the second, third, and fourth breakdown voltages and greater than the first breakdown voltage.

* * * * *